(12) United States Patent
Li et al.

(10) Patent No.: US 10,523,411 B2
(45) Date of Patent: Dec. 31, 2019

(54) PROGRAMMABLE CLOCK DATA RECOVERY (CDR) SYSTEM INCLUDING MULTIPLE PHASE ERROR CONTROL PATHS

(71) Applicant: Intel Corporation, Santa Clara, CA (US)

(72) Inventors: Shenggao Li, Pleasanton, CA (US); Ji Chen, Sunnyvale, CA (US); Michael De Vita, Santa Clara, CA (US); Fulvio Spagna, San Jose, CA (US); Guluke Tong, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/939,795

(22) Filed: Mar. 29, 2018

(65) Prior Publication Data

US 2019/0305926 A1 Oct. 3, 2019

(51) Int. Cl.
| | |
|---|---|
| *H04L 7/033* | (2006.01) |
| *G06F 13/40* | (2006.01) |
| *G06F 13/42* | (2006.01) |
| *H03L 7/089* | (2006.01) |
| *H03L 7/091* | (2006.01) |

(52) U.S. Cl.
CPC ........ *H04L 7/0331* (2013.01); *G06F 13/4063* (2013.01); *G06F 13/4282* (2013.01); *H04L 7/0337* (2013.01); *G06F 2213/0026* (2013.01); *H03L 7/0891* (2013.01); *H03L 7/091* (2013.01); *H03L 2207/50* (2013.01)

(58) Field of Classification Search
CPC ... H03L 7/091; H03L 7/0891; H03L 2207/50; H03L 7/0991; H03L 2207/06; H03L 7/085; H03L 7/0807; H03L 7/089; H04L 7/033

USPC ......................................................... 375/373
See application file for complete search history.

(56) References Cited

U.S. PATENT DOCUMENTS 9,197,396 B1 * 11/2015 Srinivasa .............. H04L 7/0016
2007/0001723 A1    1/2007 Lin
(Continued)

FOREIGN PATENT DOCUMENTS

KR        20120131845        12/2012

OTHER PUBLICATIONS

"International Application Serial No. PCT US2019 024616, International Search Report dated Jul. 12, 2019", 3 pgs.
(Continued)

*Primary Examiner* — Leila Malek
(74) *Attorney, Agent, or Firm* — Schwegman Lundberg & Woessner, P.A.

(57) ABSTRACT

Some embodiments include apparatus having sampling circuitry, a first circuit path, a second circuit path, and a digitally controlled oscillator (DCO). The sampling circuit samples an input signal and provide data information and phase error information based on the input signal. A first circuit path provides proportional control information based on the data information and phase error information. A second circuit path provides integral control information based on the data information and phase error information. The first circuit path operates at a frequency higher than the second circuit path. The DCO generates a clock signal and controls the timing of the clock signal based on the integral control information and the proportional control information.

20 Claims, 7 Drawing Sheets

(56) References Cited

U.S. PATENT DOCUMENTS

| | | | |
|---|---|---|---|
| 2007/0002993 A1 | 1/2007 | Wang et al. | |
| 2009/0206941 A1* | 8/2009 | Wang | H03C 3/0925 |
| | | | 332/119 |
| 2010/0283549 A1* | 11/2010 | Wang | H03L 7/087 |
| | | | 331/34 |
| 2012/0139654 A1* | 6/2012 | Ohara | H03L 7/093 |
| | | | 331/36 C |
| 2012/0235720 A1 | 9/2012 | Jiang et al. | |
| 2012/0257693 A1 | 10/2012 | Sindalovsky et al. | |
| 2013/0027119 A1* | 1/2013 | Mahadevan | H03L 7/091 |
| | | | 327/531 |
| 2017/0093558 A1* | 3/2017 | Ramezani | H04L 7/0029 |
| 2018/0152283 A1* | 5/2018 | Choi | H03L 7/089 |
| 2018/0183567 A1* | 6/2018 | Yoo | H03L 7/093 |

OTHER PUBLICATIONS

"International Application Serial No. PCT US2019 024616, Written Opinion dated Jul. 12, 2019", 7 pgs.

\* cited by examiner

PROGRAMMABLE CLOCK DATA RECOVERY (CDR) SYSTEM INCLUDING MULTIPLE PHASE ERROR CONTROL PATHS

TECHNICAL FIELD

Embodiments described herein pertain to data transmission. Some embodiments relate to clock data recovery (CDR) systems at receiver circuitry.

BACKGROUND

Many electronic devices or systems, such as computers, tablets, digital televisions, include components (e.g., integrated circuit chips) located on a circuit board. The components may communicate with each other using signals that can carry data. The signals are usually transmitted on conductive lines, such as metal-based traces, on the circuit board. As technology advances, some electrical components may communicate with each other using relatively high frequency (e.g., 2 Gigahertz or higher) signals. Such high frequency signals may be used to transmit data at a relatively high data rate (e.g., 2 Gigabits per second or higher). Some conventional receiver components may be able to receive data at such a high data rate. However, at a certain higher data rate, such conventional receiver components may suffer from increased internal timing delay or power consumption.

DETAILED DESCRIPTION

Figure 1:
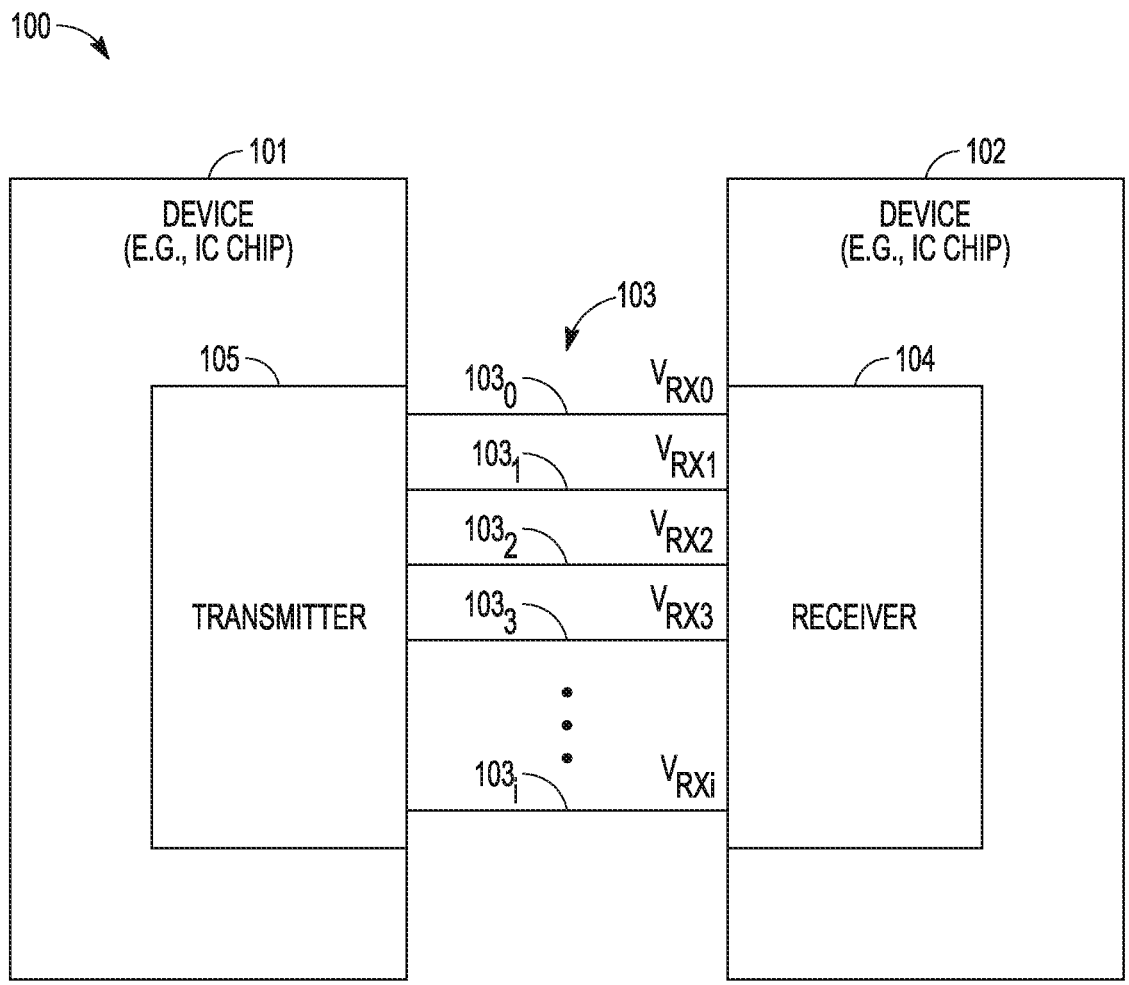
FIG. 1 shows an apparatus including devices and a channel between the devices, according to some embodiments described herein.

The techniques described herein relate to serial input/output (IO) clock data recovery (CDR) systems. The described techniques can be applicable to high-speed PHY (physical layer defined by Open Systems Interconnection (OSI) model) interconnections that can operate at a relatively higher speed. Examples of such interconnections include Peripheral Component Interconnect Express (e.g., PCIe Gen4 and subsequent generation) that can operate at a relatively high speed (up to 32 Gbps (Gigabits per second) or higher), Thunderbolt 3 (e.g., operating at 20 Gbps), and 25G Ethernet.

In a CDR system, CDR latency optimization is a consideration in addition to mitigation of clock jitter (e.g., deterministic jitter (DJ) and random jitter (RJ)). In some conventional CDR systems, a phase-interpolator (PI) has been used and the latency (e.g., measured in terms of unit interval (UI)) from the phase detector in such CDR systems, via the proportional/integral filter) to the PI input may be suitable for some interconnection standards. However, using such conventional CDR systems in some other interconnection standards (e.g., PCIe Gen4 and other standards) may pose a drawback, such as increased. CDR latency or increased power consumption in the filtering operation in the CDR system.

Theoretical analysis shows that the amplitude of the self-oscillation of the CDR loop (also known as limit cycle) in a receiver (that employs the CDR system) can be directly proportional to the latency in the proportional control path of the loop filter. Minimizing such latency can improve the timing margin in the receiver. However, based on theoretical analysis and simulations, the proportional control path in the CDR loop may have to be decoupled from the integral control path to fundamentally enable latency reduction.

In some conventional CDR systems that use an LC (inductor-capacitor) digitally controlled oscillator (DCO) to generate a clock signal for use in the data and clock recovery, frequency control of the proportional control path and integral control path in such conventional CDR systems is separated through different circuitry that control the frequency of the clock signal generated by the DCO. However, in conventional CDR systems, the phase detector logic along the proportional control path can be complex in order to support multiple data rates or operation modes (e.g., Mueller-Muller phase detector, and other data filter functions). Thus, pipeline stages are normally used in some conventional CDR systems to support relatively higher interconnect data rates, resulting in a relatively higher latency. This high latency is a limitation suffered by some conventional CDR systems.

The techniques described herein include a CDR system that can have improvements and benefits over some conventional CDR systems, including lower CDR latency, lower power consumption, reduced area, and/or reduced jitter. The described techniques include a ring-oscillator-based DCO, a programmable phase detector, a fast phase error detection path with minimal latency for proportional control, and a slow phase error detection path with integral control and alternative proportional control. In the described techniques, a low-noise ring-oscillator-based CDR topology (instead of using PI, or LC DCO) is adopted with the proportional and integral control paths separated through different unit control capacitor circuits. The fast phase error detection path of the described techniques can include a programmable phase detector that can provide proportional control to the DCO and can accommodate various timing detection schemes for minimal latency. The slow phase error detection path of the described techniques can provide integral and alternative proportional control to the DCO and can be applicable for applications that are less jitter sensitive and more power efficient, and can be implemented in synthesized logic. The described techniques also include time-delay matching scheme between logic path (e.g., data path) and a clock path of the fast phase error detection path. The clock signal used in this scheme can be adopted to operate at different clock frequencies (e.g., 2UIs or more).

This time-delay matching scheme allows the fast phase error detection path of the described CDR system to have fewer stages (e.g., fewer logic pipeline stages) in comparison with some conventional CDR systems. Fewer stages can improve (e.g., reduce) the CDR latency of the described CDR system. This can allow the described CDR system to be used for relatively high-speed interconnections (e.g., PCIe, Thunderbolt, and Ethernet) and allow the described CDR system to achieve one or more of the following improvements: lower CDR latency, lower power consumption, reduced area, and/or reduced jitter.

In sum, besides other embodiments described below, the techniques described herein include an all-digital CDR structure having a low-noise ring-oscillator based DCO to achieve the above-mentioned improvements. In one aspect (e.g., at system level), the techniques described herein can avoid a conventional phase-interpolator scheme and allow using a DCO (e.g., ring-oscillator based DCO) to in order to enable a fast phase error detection path and reduced proportional control latency. In another aspect (e.g., at circuit level), the techniques described herein can allow implementing both a programmable fast-phase error detection path and a slow-phase error detection path for integral and fractional control. The described programmable fast-phase error detection path can include major CDR timing recovery functions (e.g., phase detectors, including alexa.nder bang-bang, Qureshi, and other types of phase detections). In a further aspect (e.g., at circuit level), the techniques described herein include a time-delay matching scheme that can be adopted to match a logic path (e.g., data path) with a clock path to significantly reduce pipeline stages in the CDR system, thereby reducing CDR latency. Other improvements and benefits of the described techniques are discussed below.

FIG. 1 shows an apparatus 100 including devices 101 and 102, and a channel 103 between devices 101 and 102, according to some embodiments described herein. Apparatus 100 can include or be included in an electronic device or system, such as a computer (e.g., server, desktop, laptop, or notebook), a tablet, a cellular phone, or other electronic devices or systems. Each of devices 101 and 102 can include an integrated circuit (IC) device (e.g., an IC chip). Devices 101 and 102 can include controllers (e.g., processors, input/output controllers, memory devices, or other electronic devices). As shown in FIG. 1, devices 101 and 102 can include a transmitter 105 and a receiver 104, respectively.

Channel 103 can include lanes $103_0$, $103_1$, $103_2$, and $103_3$ through $103_i$ to conduct signals between devices 101 and 102. Each of lanes $103_0$ through $103_i$ can include conductive traces (e.g., wirelines such as metal-based traces) on a circuit board (e.g., printed circuit board) where devices 101 and 102 are located. Devices 101 and 102 can communicate with each other by providing signals on lanes $103_0$ through $103_i$. As shown in FIG. 1, for example, transmitter 105 may transmit signals $V_{RX0}$, $V_{RX1}$, $V_{RX2}$, and $V_{RX3}$ through $V_{RXi}$ to receiver 104 on lanes $103_0$, $103_1$, $103_2$, and $103_3$ through $103_i$, respectively.

Devices 101 and 102 may communicate with each other using signals at a relatively high frequency that correspond to a relatively high data rate (e.g., up to 32 gigabits per second (Gb/s) or higher per lane). At such a high data rate, inter-symbol interference (ISI) may occur when signals (e.g., $V_{RX0}$ through $V_{RXi}$) transmitted by transmitter 105 arrive at receiver 104.

Receiver 104 can include receivers described below with reference to FIG. 2 through FIG. 6.

Figure 2:
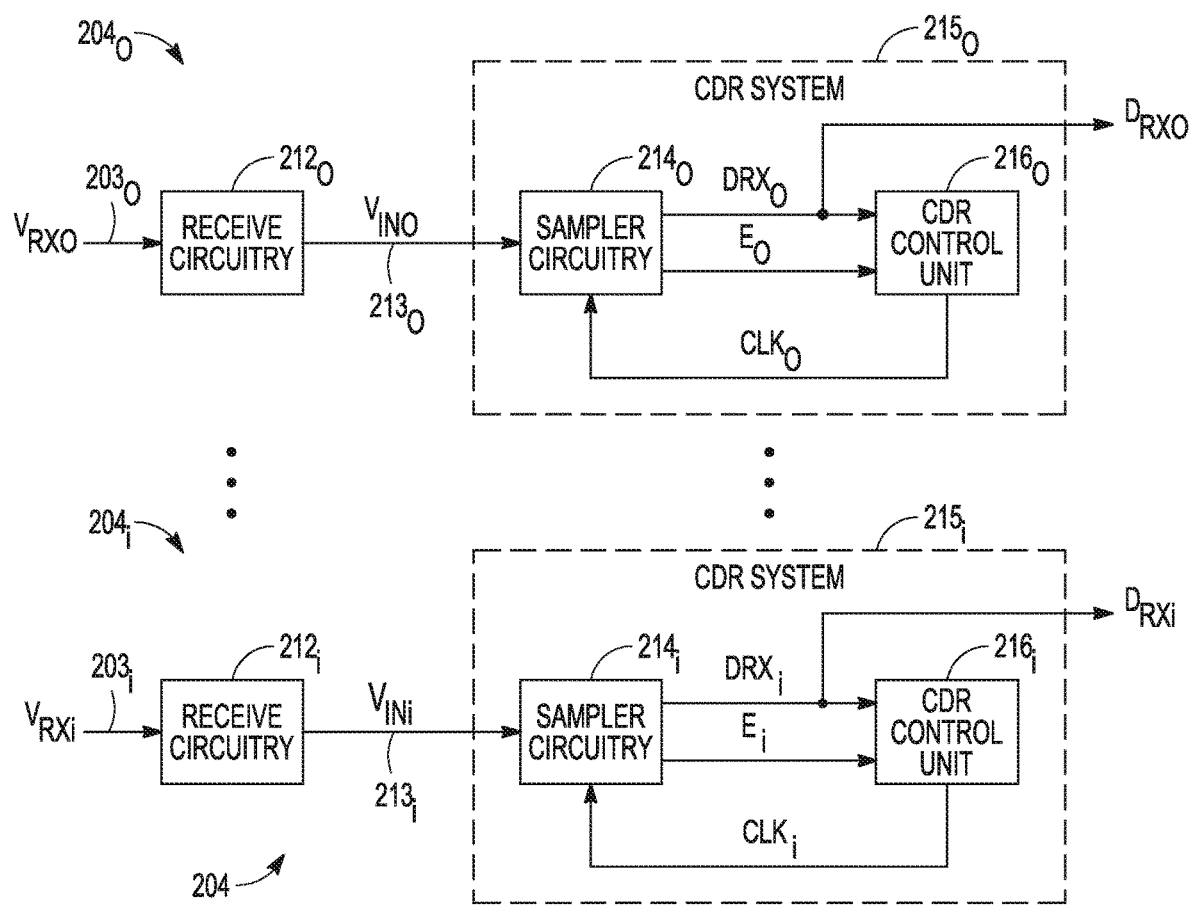
FIG. 2 shows a block diagram of a receiver including receiver lanes and corresponding CDR systems, according to some embodiments described herein.

FIG. 2 shows a block diagram of a receiver 204 including receiver lanes $204_0$ through $204_i$ and CDR systems $215_0$ through $215_i$, according to some embodiments described herein. FIG. 2 shows an example where receiver 204 includes two receiver lanes $204_0$ through $204_i$. The number of receiver lanes can vary. Receiver 204 can correspond to receiver 104 of FIG. 1.

As shown in FIG. 2, receiver lane $204_0$ can receive input information (e.g., analog input signal) that can include a signal $V_{RX0}$ on a connection $203_0$. Receiver lane $204_0$ can generate information $D_{RX0}$ (e.g., digital output information) that has a value based on the value of signal $V_{RX0}$. Connection $203_0$ can include at least one conductive node (e.g., a single conductive node or multiple conductive nodes).

Receiver lane $204_i$ can receive input information (e.g., analog input signal) that can include a signal $V_{RXi}$ on a connection $203_i$. Receiver lane $204_i$ can generate information $D_{RXi}$ (e.g., digital output information) that has a value based on the value of signal $V_{RXi}$. Connection $203_i$ can include at least one conductive node (e.g., a single conductive node or multiple conductive nodes).

Signals $V_{RX0}$ and $V_{RXi}$ can be provided to receiver 204 by a transmitter, such as transmitter 105 of FIG. 1. Signal $V_{RX0}$ can carry information representing bits (e.g., data bits) transmitted in a series fashion (one bit after another) on connection $203_0$. Similarly, signal $V_{RXi}$ can carry information representing bits (e.g., data bits) transmitted in a series fashion (one bit after another) on connection $203_i$. In FIG. 2, each of information $D_{RX0}$ and $D_{RXi}$ can be represented by a digital signal that can carry bits (e.g., data bits). Information $D_{RX0}$ and $D_{RXi}$ can be provided to other components (e.g., components (not shown) in receiver 204) coupled to receiver lanes $204_0$ and $204_i$ for further processing.

As shown in FIG. 2, receiver lane $204_0$ can include receiver analog front-end circuitry $212_0$ and CDR system $215_0$. Receiver analog front-end circuitry $212_0$ can perform an equalization operation (or operations) to generate input information (e.g., equalized input information) in the form of signal $V_{IN0}$ on a connection based on signal $V_{RX0}$. For example, receiver analog front-end circuitry $212_0$ can include a linear equalizer (e.g., a continuous time linear equalizer (CITE)) or a combination of a linear equalizer and decision feedback equalizer (DFE). As an example, connection $213_0$ in receiver lane $204_0$ can be the output of a summing circuit (e.g., summing node) that can be part of a feedback path of a DFE (not shown) of receiver analog front-end circuitry $212_0$. Receiver analog front-end circuitry $212_0$ can perform an equalization operation (e.g., performed by a CTLE of receiver analog front-end circuitry $212_0$) to equalize (e.g., reduce noise) in signal $V_{RX0}$. Receiver analog front-end circuitry $212_0$ can also perform an equalization operation (e.g., performed by a DFE of receiver analog front-end circuitry $212_0$) to reduce inter-symbol interference (ISI) in signal $V_{IN0}$ on connection $213_0$.

CDR system $215_0$ of receiver analog front-end circuitry $212_0$ can include sampler circuitry $214_0$ and CDR control unit $216_0$. Sampler circuitry $214_0$ can operate to receive signal $V_{IN0}$ from receiver analog front-end circuitry $212_0$. Signal $V_{IN0}$ can carry information representing a number of bits (e.g., data bits) transmitted in a series fashion (one bit after another) on a connection (e.g., node or nodes) $213_0$. Sampler circuitry $214_0$ can include a combination of data and edge (e.g., error) sampler circuits to sample signal $V_{IN0}$ and provide (e.g., generate) information (e.g., data information) $D_{RX0}$ and information (e.g., phase error information) $E_0$ based on the sampling of signal $V_{IN0}$. Sampler circuitry $214_0$ can sample signal $V_{IN0}$ based on the timing (e.g., phase and frequency) of clock information $CLK_0$ (which can include at least clock signal). In a sampling operation, sampler circuitry $214_0$ can determine the value (e.g., voltage value) of signal $V_{IN0}$ during a specific time interval (e.g., within one unit interval (UI) using the phase (e.g., edge) of $CLK_0$ as reference timing).

CDR control unit $216_0$ can operate as a CDR control loop (e.g., a feedback loop) to improve accuracy of sampling of signal $V_{IN0}$, thereby improving the accuracy of information $D_{RX0}$. For example, CDR control unit $216_0$ can adjust the timing (e.g., the phase) of clock information (i.e., CLK-based information) $D_{RX0}$ and $E_0$ to improve accuracy in the sampling of $V_{IN0}$.

In a similar arrangement, receiver lane $204_i$ can include a receiver analog front-end circuitry $212_i$ and a CDR system $215_i$ that includes sampler circuitry $214_1$ and CDR control unit $216i$. Similar to receiver lane $204_0$, receiver analog front-end circuitry $212_1$ of receiver lane $204_1$ can operate to receive signals $V_{RXi}$ on a connection $203_i$ and generate signal $V_{INi}$ on a connection $213_i$. Signal $V_{INi}$ can carry information representing bits (e.g., data bits) transmitted in a series fashion. Sampler circuitry $214_i$ can operate to sample signal $V_{INi}$ based on timing (e.g., phase and frequency) of clock information $CLK_i$ (e.g., which can include at least one clock signal). Sampler circuitry $214_i$ can provide information (e.g., data information) $D_{RXi}$ and information (e.g., phase error information) $E_i$ based on the sampling of signal $V_{INi}$. CDR control unit $216_i$ can operate as a CDR control loop to adjust the timing (e.g., the phase) of clock information $CLK_i$ based on the information $D_{RXi}$ and $E_i$ to improve accuracy in the sampling of $V_{INi}$, thereby improving the accuracy of information $D_{RXi}$.

For simplicity, the techniques (e.g., clock data recovery techniques) presented herein describe information in the context of a single signal (e.g. a single-ended) such as signals $V_{RX0}$, $V_{RXi}$, $V_{IN0}$, and $V_{INi}$. However, one skilled in the art would recognize that the described techniques can also be applicable to information that include differential signals. For example, each of receiver lanes $204_0$ and $204_i$ can be configured to operate in differential mode to process differential signals. As an example, information on connection $203_0$ includes differential signals (e.g., signals $V_{RX0}$+ and $V_{RX0}$− instead of a single signal $V_{RX0}$) and connection $203_0$ can include two separate conductive lines (or nodes) to carry the differential signals. In this example, information on connection $213_0$ can be differential signals (e.g., signals $V_{IN0}$+ and $V_{IN0}$− instead of a single signal $V_{IN0}$) and connection $213_0$ can include two separate conductive lines (or nodes) to carry the differential signals.

Each of CDR system $215_0$ and $215_i$ can include components and operations of the CDR systems described below with reference to FIG. 3 through FIG. 6.

Figure 3:
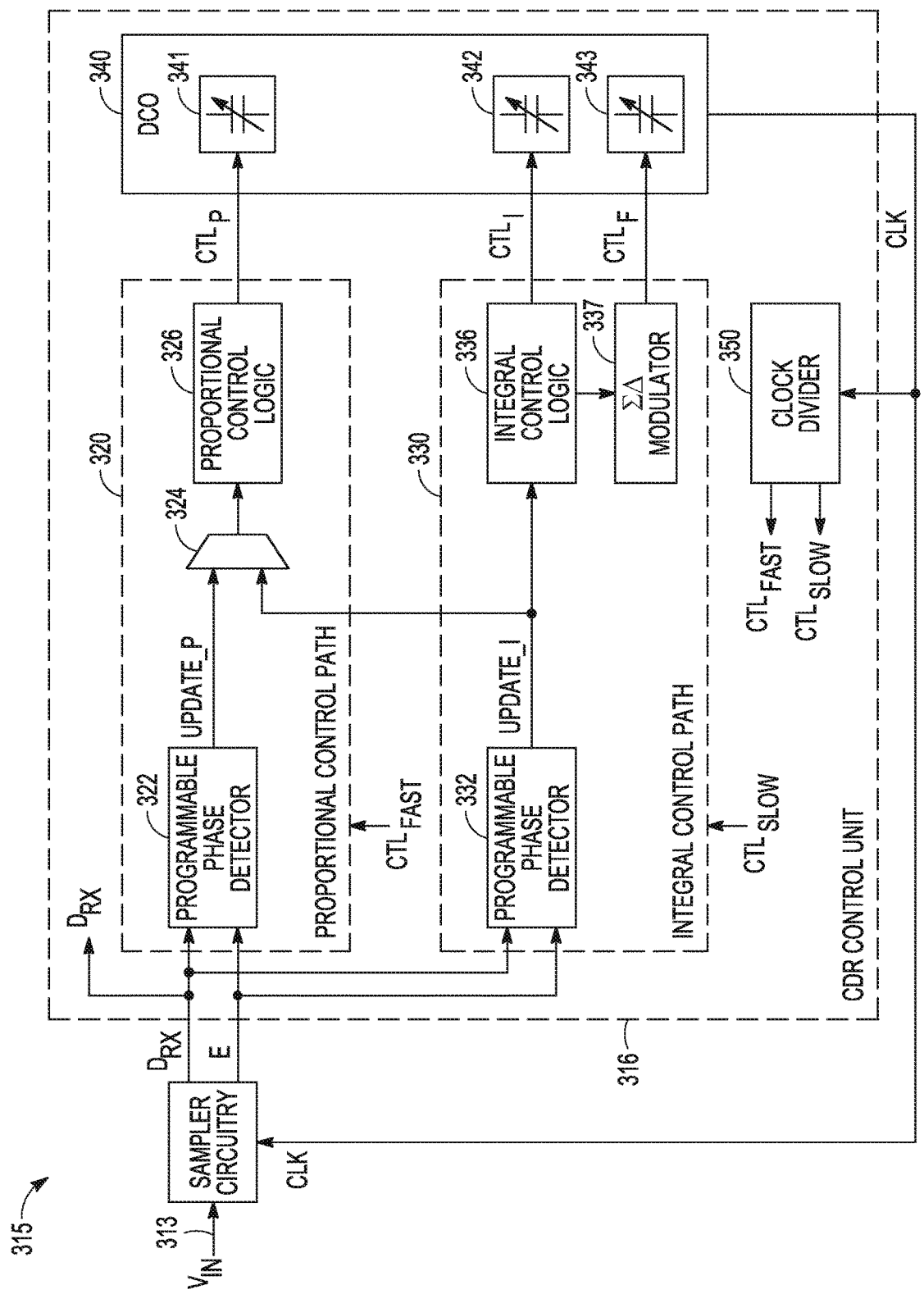
FIG. 3 shows a block diagram of a CDR system, according to some embodiments described herein.

FIG. 3 shows a block diagram of a CDR system 315, according to some embodiments described herein. CDR system 315 can be included in receiver 204 of FIG. 2, such that CDR system 315 can be used as each of CDR system $215_0$ and $215_i$ of receiver 204. CDR system 315 can include sampler circuitry 314, and CDR control unit 316. Sampler circuitry 314 and CDR control unit 316 can correspond to sampler circuitry $214_0$ and CDR control unit $216_0$ (FIG. 2), respectively, or sampler circuitry $214_i$ and CDR control unit $216_1$ (FIG. 2), respectively.

In FIG. 3, sampler circuitry 314 can operate to receive YIN and generate information $D_{RX}$ and E based on the sampling of signal $V_{IN}$ using timing (e.g., phase and frequency) of clock information CLK. Clock information CLK can include (e.g., can be presented by) one or more clock signals. Sampler circuitry 314 can include samplers 314' to receive $V_{IN}$, and demultiplexer (DEMUX) 321 and demultiplexer (DEMUX) 331. DEMUX 321 can be 1:X DEMUX and DEMUX 331 can be a 1:Y DEMUX, where X and Y are integers, and X and Y can be the same (have the same value) or different (have different values). As an example, DEMUX 321 can be a 1:2 DEMUX and DEMUX 331 can be a 1:4 DEMUX.

Each of DEMUX 321 and 331 can include high-speed sequential logic circuits that can perform demultiplexing operation (e.g., deserializing function) to provide information (e.g., data information and phase error information) from samplers 314' to CDR control unit 316 at different latencies. As shown in FIG. 3, CDR control unit 316 can include paths (e.g., circuit paths) 320 and 330 (described in more detail below). As shown in FIG. 3, DEMUX 321 can include an input coupled to an output of samplers 314', and an output coupled to an input of path 320 to provide information (e.g., data information and phase error information) from samplers 314' to path 320. DEMUX 331 can include an input coupled to the output of DEMUX 321, and an output coupled to an input of path 330 to provide information (e.g., data information and phase error information) from samplers 314' (via DEMUX 321) to path 330.

Path 320 can operate at lower latency than (faster than) path 330. For example, path 320 can operate at a higher frequency than path 330. DEMUX 321 and DEMUX 331 can operate to provide information to paths 320 and 330 at different speeds (which can be based on the operating frequencies of paths 320 and 330). For example, information from samplers 314' can be provided to path 320 at a higher speed than information provided from samplers 314' to path 330.

CDR control unit 316 can include DCO 340 coupled to paths 320 and 330. DCO 340 can operate to generate clock information CLK. CDR control unit 316 can operate to provide control information to control DCO 340 (e.g., to adjust the timing (e.g., the phase) of clock information CLK). For example, path 320 and 330 can operate as a proportional control path and integral control path, respectively, to provide control information $CTL_P$ (e.g., proportional control information) and control information $CTL_I$ (e.g., integral control information), respectively, to DCO 340. Path 330 can also provide control information (e.g., alternative (e.g., fractional) control information) $CTL_F$. Each of control information $CTL_P$, $CTL_I$, and $CTL_F$ can be digital control information that can include at least one bit (e.g., one control bit or multiple control bits).

The values of control information $CTL_P$, $CTL_I$, and $CTL_F$ can be used to adjust the timing (e.g., the phase, the frequency, or both) of clock information CLK. The frequency of clock information CLK can be based in part on an initial frequency (e.g., a predetermined frequency) of clock information CLK, and the values of control information $CTL_P$, $CTL_I$, and $CTL_F$. The phase of the clock information CLK can be based on the function of the frequency of clock signal CLK over time.

DCO 340 can include a low-noise ring-oscillator-based structure. For example, DCO 340 can include separate capacitor circuits 341, 342, and 343 that can be part of the circuit path (not shown) of DCO 340 that generates clock information CLK. For simplicity and not to obscure the embodiments described herein, DCO 340 is not described in detail here. One skilled in the art would recognize that in a DCO (e.g., ring-oscillator-based DCO) such as DCO 340, the frequency and phase of an output clock signal (e.g., included in clock information CLK) generated at the output of the DCO can be controlled by controlling the circuit path that generates the output clock signal.

In FIG. 3, CDR control unit 316 can use control information $CTL_P$, $CTL_I$, $CTL_F$ to control capacitor circuits 341, 342, and 343, respectively. Thus, capacitor circuits 341, 342, and 343 can be separately (e.g., independently) controlled by respective control information $CTL_P$, $CTL_I$, and $CTL_F$. CDR control unit 316 can adjust (e.g., increase, decrease, or keep the same) the capacitance values used (e.g., applied in) capacitor circuits 341, 342, and 343 based on the values of control information $CTL_P$, $CTL_I$, and $CTL_F$, respectively, in order to adjust the timing of clock information CLK. For example, control bits of control information $CTL_P$, $CTL_I$, and $CTL_F$ can be used to control (e.g., turn on or turn off) respective transistors (not shown) in DCO 340 associated with capacitor circuits 341, 342, and 343 in order to control the capacitance values of corresponding capacitor circuits 341, 342, and 343. Thus, a timing (e.g., phase, frequency, or both) a clock signal included in clock information CLK can be based at least in part on the capacitance values of capacitor circuits 341, 342, and 343. Controlling the values of capacitor circuits 341, 342, and 343 can adjust the timing (e.g., can shift the phase) of clock information CLK until the timing satisfies the timing relationship between the information $D_{RX}$ and clock information CLK.

As shown in FIG. 3, CDR control unit 316 can include a clock divider 350 that can operate to generate clock signals $CLK_{FAST}$ and $CLK_{SLOW}$ based on clock information CLK. Clock signal $CLK_{FAST}$ has a higher frequency than clock signal $CLK_{SLOW}$. Path 320 (e.g., proportional control path) can operate using the timing (e.g., frequency) of clock signal $CLK_{FAST}$. Path 330 (e.g., integral control path) can operate using the timing (e.g., frequency) of clock signal $CLK_{SLOW}$.

As mentioned above, path 320 can operate at lower latency than path 330. Thus, control information $CTL_P$ can be provided to DCO 340 faster (in a shorter amount of time) than control information $CTL_I$ and $CTL_F$ are provided to DCO 340. The frequency of clock signal $CLK_{FAST}$ can be selected, such that control information $CTL_P$ can be provided to the DCO 340 in a timely manner (e.g., within a minimum number of clock periods of clock signal $CLK_{FAST}$) in order to maintain proper operation of CDR control unit 316 (e.g., in order to avoid or reduce ringing at the clock generated at the output of DCO 340).

As shown in FIG. 3, selector 324 can include an input coupled to the output of programmable phase detector 322, an input coupled to the output of programmable phase detector 332, and an output coupled to the proportional control logic 326. In certain modes of CDR control unit 316, selector 324 can operate to allow phase detection function from path 330 (e.g., from programmable phase detector 332) to be used in path 320 (e.g., for debugging or lower power operation).

As shown in FIG. 3, path 320 can include a programmable phase detector 322, a multiplexor 324, and proportional control logic 326. Programmable phase detector 322 can generate information (e.g., phase error information) UPDATE_P based on information $D_{RX}$ and E. Information UPDATE_P can include at least one bit (e.g., a single bit or multiple bits). Propagation control logic 326 can generate control information $CTL_P$ that can have an initial (e.g., a predetermined) value to control DCO 340 (e.g., control the value of capacitor circuit 341) to cause clock information CLK to have an initial (e.g., predetermined) frequency. Propagation control logic 326 can adjust the value of control information $CTL_P$ based on the value of UPDATE_P to provide proportional control to DCO 340 in order to maintain the timing (e.g., phase and frequency) of clock information CLK within a specific value. For example, if information UPDATE_P has one value (e.g., a digital value), propagation control logic 326 can adjust the value of control information $CTL_P$ to adjust the timing of clock information CLK (e.g., shift the phase of a clock signal included in clock information CLK in one direction (e.g., shift right)). In this example, the value of control information $CTL_P$ may cause a change (e.g., an increase) in the capacitance value of capacitor circuits 341 used in the circuit path in DCO 340 that generates clock information CLK. In another example, if information UPDATE_P has another value (e.g., another digital value), propagation control logic 326 can adjust the value of control information $CTL_P$ to adjust the timing of clock information CLK (e.g., shift the phase of a clock signal included in clock information CLK in another direction (e.g., shift left)). In this example, the value of control information $CTL_P$ may cause a change (e.g., a decrease) in the capacitance value of capacitor circuits 341 used in the circuit path in DCO 340 that generates clock information CLK.

As shown in FIG. 3, path 330 can include a programmable phase detector 332 and integral control logic 336. Programmable phase detector 332 can generate information (e.g., phase error information) UPDATE_I based on information $D_{RX}$ and E. Information UPDATE_I can include at least one bit (e.g., a single bit or multiple bits). Integral control logic 336 can generate control information $CTL_I$ that can have an initial (e.g., a predetermined) value to control DCO 340 (e.g., control the value of capacitor circuit 342) to cause clock information CLK to remain at an initial (e.g., predetermined) frequency. Integral control logic 336 can adjust the value of control information $CTL_I$ based on the value of information UPDATE_I to provide proportional control to DCO 340 in order to maintain the timing (e.g., phase and frequency) of clock signal CLK within a specific value. For example, if information UPDATE_I has one value (e.g., a digital value), proportional control logic 326 can adjust the value of $CTL_I$ to adjust the timing of clock information CLK (e.g., shift the phase of a clock signal included in clock information CLK in one direction (e.g., shift right)). In this example, the value of $CTL_I$ may cause a change (e.g., an increase) in the capacitance value of capacitor circuit 342 used in the circuit path in DCO 340 that generates clock information CLK. In another example, if information UPDATE_I has another value (e.g., another digital value), integral control logic 336 can adjust the value of $CTL_I$ to adjust the timing of clock information CLK (e.g., shift the phase of a clock signal included in clock information CLK in another direction (e.g., shift left)). In this example, the value of $CTL_I$ may cause a change (e.g., a decrease) in the capacitance value of capacitor circuit 342 used in the circuit path in DCO 340 that generates clock information CLK.

As shown in FIG. 3, path 330 can include a sigma-delta modulator (SDM) 337 that can generate control information $CTL_F$ based on outputs from integral control logic 336. For example, SDM 337 can receive fractional bits from integral control logic 336 and generate control information $CTL_F$ that can have a value based on the average of the value of fractional bits with respect to a time interval. In some cases, the values of control information $CTL_F$ and $CTL_I$ may cause excessive jitter on clock information CLK. Control information $CTL_F$ can have a higher frequency than clock signal $CLK_{SLOW}$ in order to allow a smaller step size to control DCO 340 (e.g., control capacitor circuit 343) to avoid or reduce jitter at the clock signal generated at the output of DCO 340.

Programmable phase detector 322 can be implemented to be suitable for a wide operating range (e.g., up to 32 Gbps, or higher) with improved power-efficiency and reduced CDR latency. CDR system 315 may further allow multiple phase-detection capabilities, such as baud-rate (full "edge-rate" and quarter "edge-rate") and oversampling, to allow CDR system 315 to be applicable for multiple standards.

Figure 4A:
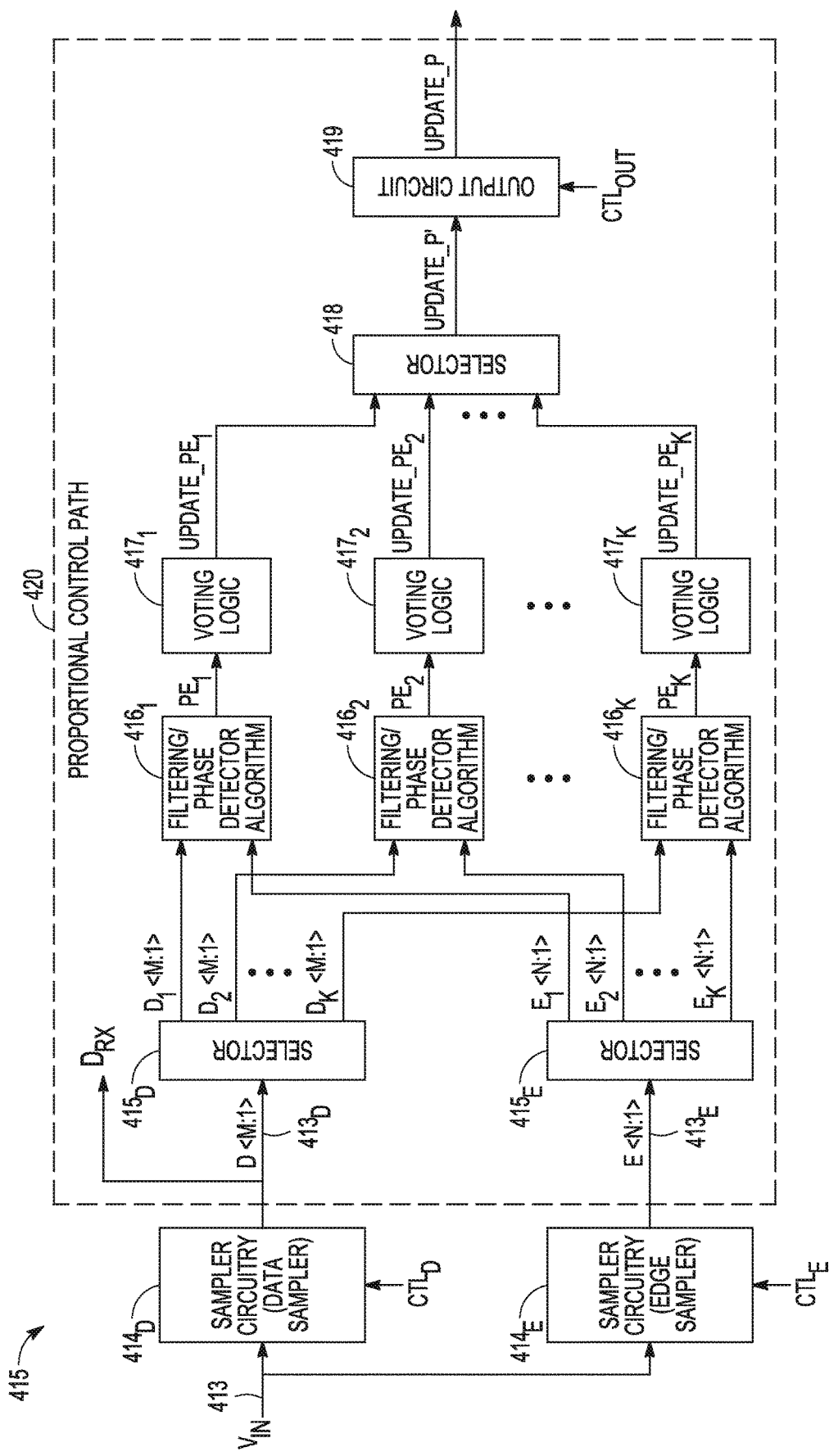
FIG. 4A shows a block diagram of a CDR system including a proportional control path, according to some embodiments described herein.

FIG. 4A shows a block diagram of CDR system 415 including a path 420 (e.g., proportional control path), according to some embodiments described herein. CDR system 415 can correspond to CDR system 315 FIG. 3. For example, path 420 can correspond to part of proportional control path 320 of FIG. 3. Signal $V_{IN}$ and information UPDATE_P in FIG. 4A can correspond to signal $V_{IN}$ and information UPDATE_P, respectively, of FIG. 3. CDR system 415 of FIG. 4 can include additional components (e.g., an integral control path, a DCO, and other components) similar to those of path 330 and DCO 340 of CDR system 315. For simplicity, such additional components of CDR system 415 are omitted from FIG. 4A.

As shown in FIG. 4A, CDR system 415 can include a sampler circuit (e.g., a data sampler) 414D, a sampler circuit (e.g., an edge sampler) 414E, a 1:N demultiplexer (1:N DEMUX) 415D, a 1:N demultiplexer (1:N DEMUX) 415E, filtering and phase error algorithm $416_1$ through $416_K$, voting logics (e.g., logic circuitry) $417_1$ through $417_K$, a multiplexer (N:1 MUX) 418, and an output circuit (e.g., a D flip-flop) 419.

Sampler circuits 414D and 414E can receive the same signal $V_{IN}$ from connection 413. Signal $V_{IN}$ can include bits of information (e.g., bits of data) that are transmitted in a series fashion (one bit after another) on connection 413. Sampler circuit 414D can operate to generate information $D_{RX}$, which can be provided to other components of the receiver (e.g., receiver 104 (FIG. 1) or receiver 204 (FIG. 2)) for further processing.

Sampler circuits 414D and 414E, and output circuit 419, can operate using timing (e.g., phase and frequency) of clock signals $CLK_D$, $CLK_E$, and $CLK_{OUT}$, respectively. Clock signals $CLK_D$, $CLK_E$, and $CLK_{OUT}$ can be part of clock information CLK generated by the DCO (not shown) of CDR system 415.

Sampler circuit 414D can sample signal $V_{IN}$ based on timing (e.g., phase and frequency) of clock signal $CLK_D$. Sampler circuit 414D can provide information (e.g., data information) D<N:1> based on the sampling of signal $V_{IN}$. Information D<N:1> can include sampled information (e.g., data samples) $D_1$ through $D_K$ provided in a series fashion on a connection 413D.

Sampler circuit (e.g., edge sampler circuit) 414E can sample signal $V_{IN}$ based on timing (e.g., phase and frequency) of a clock signal $CLK_E$. Sampler circuit 414E can provide information (e.g., edge information) E<N:1> based on the sampling of signal $V_{IN}$. Information E<N:1> can include sampled information (e.g., edge samples) $E_1$ through $E_K$ provided in a series fashion on a connection 413E.

1:N DEMUX 415D can operate to receive information D<N:1> at its input (e.g., input node), which is coupled to a connection 413D. 1:N DEMUX 415D can provide sampled information $D_1$ through $D_K$ concurrently (e.g., provided in a parallel fashion) at its output (e.g., output nodes).

1:N DEMUX 415E can operate to receive information E<N:1> at its input (e.g., input node), which is coupled to a connection 413E. 1:N DEMUX 415E can provide sampled information $E_1$ through $E_K$ concurrently (e.g., provided in a parallel fashion) at its output (e.g., output nodes).

Figure 4B:
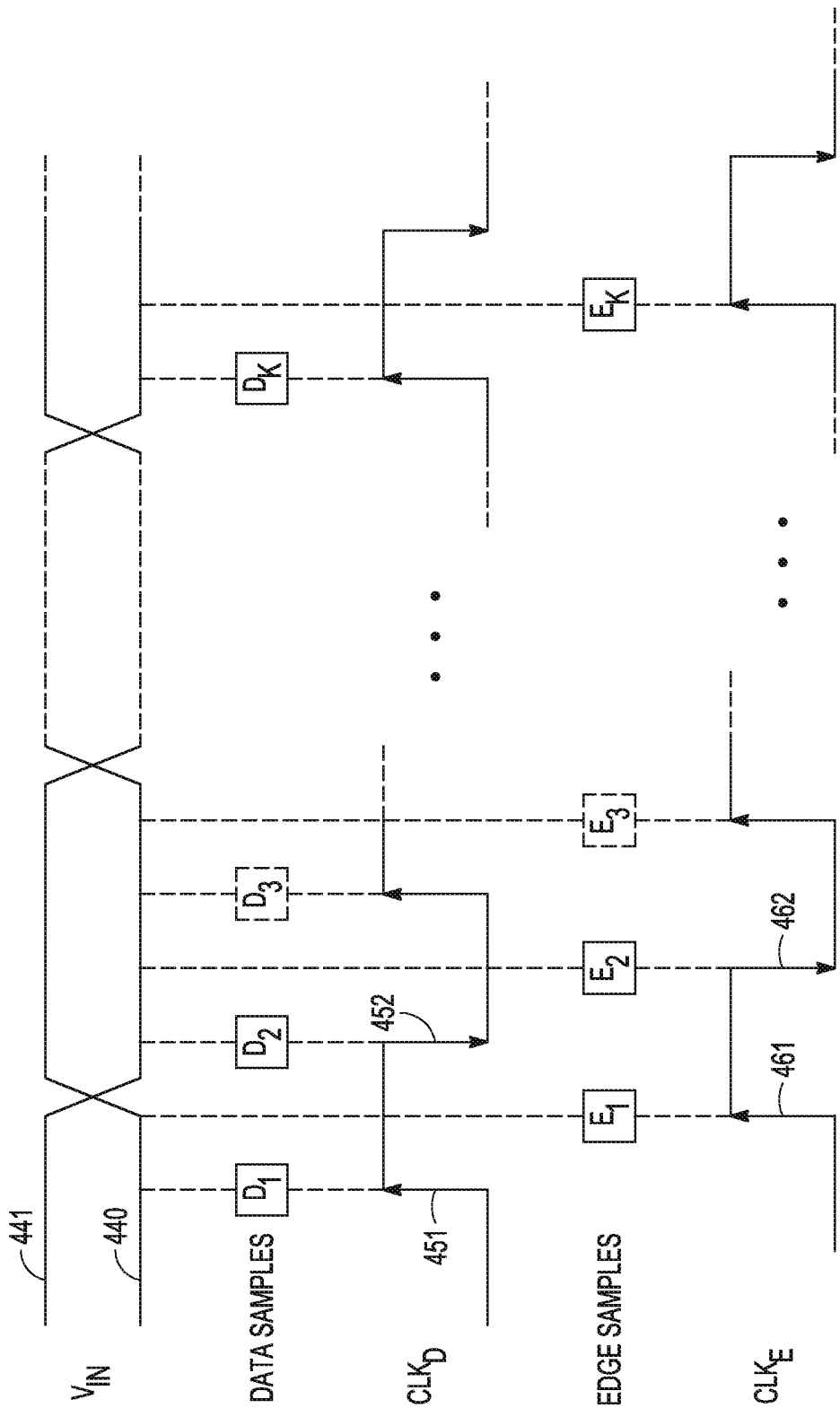
FIG. 4B is a timing diagram showing a relationship between an input signal, clock signals, data samples, and edge samples of the CDR system of FIG. 4A, according to some embodiments described herein.

FIG. 4B is a timing diagram showing a relationship between signal $V_{IN}$, clock signals $CLK_D$ and $CLK_E$, data samples $D_1$ through $D_K$ (included in sampled information D<N:1>), and edge samples $E_1$ through $E_K$ (included in sampled information E<N:1>) of FIG. 4A, according to some embodiments described herein. As shown in FIG. 4B, signal $V_{IN}$ can include either a level (e.g., voltage level) 440 or a level (e.g., voltage level) 441. Levels 440 and 441 can be used to represent the values (e.g., binary value) of data information carried by signal $V_{IN}$. Data samples $D_1$ through $D_K$ and edge samples $E_1$ through $E_K$ can be sampled from the same signal $V_{IN}$.

Data samples $D_1$ through $D_K$ can be sampled from signal $V_{IN}$ based on timing (e.g., rising and falling edges) of clock signal $CLK_D$. For example, data samples $D_1$ and $D_2$ can be sampled based on an edge 451 (e.g., rising edge) and an edge 452 (e.g., falling edge), respectively, of clock signal $CLK_D$.

Edge samples $E_1$ through $E_K$ can be sampled from signal $V_{IN}$ based on timing (e.g., rising and falling edges) of clock signal $CLK_E$. For example, edge samples $E_1$ and $E_2$ can be sampled based on an edge 461 (e.g., rising edge) and an edge 462 (e.g., falling edge), respectively, of clock signal $CLK_E$.

Clock signals $CLK_D$ and $CLK_E$ can have the same frequency. However, clock signals $CLK_D$ and $CLK_E$ can have difference phases. Thus, data samples $D_1$ through $D_K$ and edge samples $E_1$ through $E_K$ can be sampled at different points of signal $V_{IN}$ (e.g., points of signal $V_{IN}$ that are lined-up with the vertical dashed lines in FIG. 4B). FIG. 4B shows an example where clock signals $CLK_D$ and $CLK_E$ have a phase offset of 90 degrees (clock signals $CLK_D$ and $CLK_E$ are 90 degrees out of phase). However, clock signals $CLK_D$ and $CLK_E$ can have a different phase offset. Further, FIG. 4B shows a single clock signal (e.g., clock signal $CLK_D$) being used to sample signal $V_{IN}$ to provide data samples (e.g., data samples $D_1$ through $D_K$). However, multiple clock signals (e.g., using multiple corresponding data samplers) can be used to sample signal $V_{IN}$ to provide data samples. Likewise, FIG. 4B shows a single clock signal (e.g., clock signal $CLK_E$) being used to sample signal $V_{IN}$ to provide edge samples (e.g., edge samples $E_1$ through $E_K$). However, multiple clock signals (e.g., using multiple corresponding edge samplers) can be used to sample signal $V_{IN}$ to provide edge samples.

Referring to FIG. 4A, filtering and phase error algorithm $416_1$ through $416_K$ can receive corresponding data samples $D_1$ through $D_K$ and edge samples $E_1$ through $E_K$ and perform filtering and phase error detection operation (e.g., based on phase error algorithm). Filtering and phase error algorithm $416_1$ through $416_K$ can generate information $PE_1$ through $PE_K$, respectively, based on the filtering and phase error detection operation. Voting logics $417_1$ through $417_K$ can operate to generate information $UPDATE\_P_1$ through $UPDATE\_P_K$, respectively. N:1 MUX 418 can operate to generate information UPDATE_P' based on information $UPDATE\_P_1$ through $UPDATE\_Y_K$. Output circuit 419 can operate to receive (e.g., to latch) information UPDATE_P' and provide it at its output as information UPDATE_P (e.g., output information). Information UPDATE_P can include at least one bit (e.g., a single bit or multiple bits). For example, information UPDATE_P can have one value (e.g., the value of a bit or a combination of bits of information UPDATE_P) if an edge of clock signal $CLK_E$ occurs earlier than a reference timing. In another example, information UPDATE_P can have another value (e.g., the value of a bit or a combination of bits of information UPDATE_P) if an edge of clock signal $CLK_E$ occurs later than a reference timing. Based on the value of information UPDATE_P, path 420 of CDR system 415 can provide proportion control to the DCO (not shown) of CDR system 415.

The following description describes the operation of filtering and phase error algorithm $416_1$ and the operation of voting logic $471_1$. Other filtering and phase error algorithms and voting logics of CDR system 415 can operate in a similar fashion. As shown in FIG. 4A, filtering and phase error algorithm $416_1$ can generate information $PE_1$ based on data sample $D_1$ (part of sampled information D<N:1>) and edge sample $E_1$ (part of sampled information E<N:1>). The value of information $PE_1$ can indicate a timing relationship between timing of data sample $D_1$ and edge sample $E_1$. For example, the value of information $PE_1$ can indicate whether edge 461 of clock signal $CLK_E$ occurs earlier than or later than a reference timing. Voting logic $417_1$ can operate to determine whether to update (e.g., to change or not to change) the value of information $UPDATE\_P_1$ (e.g., to either cause the value of information $UPDATE\_P_1$ to change or keep the value of information $UPDATE\_P_1$ at the same value (at the present value)).

Similarly, filtering and phase error algorithm $416_2$ through $416_K$ can generate information $PE_2$ through $PE_K$, respectively. Voting logic $417_2$ through $417_K$ can operate to generate information $UPDATE\_P_2$ through $UPDATE\_P_K$, respectively. As described above, N:1 MUX 418 can operate to generate information UPDATE_P' based on information $PE_1$ through $PE_K$, and output circuit 419 can generate information UPDATE_P based on information UPDATE_P' to provide proportion control to the DCO of CDR system 415.

Figure 5A:
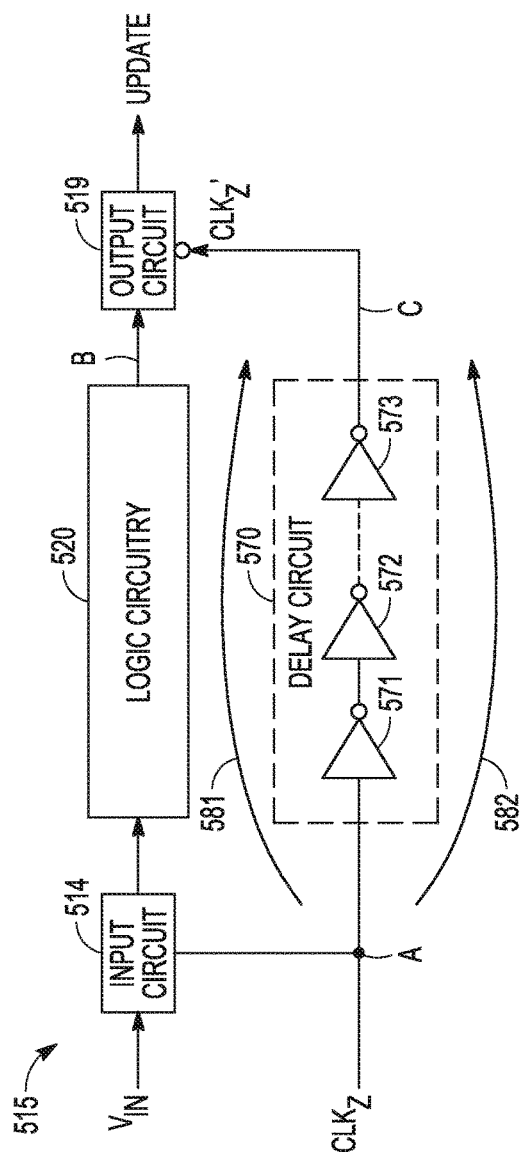
FIG. 5A is block diagram showing a CDR system including a time delay matching scheme according to some embodiments described herein.

FIG. 5A shows a block diagram of a CDR system 515 including logic and clock paths having matched timing, according to some embodiments described herein. CDR system 515 can include an input circuit (e.g., D type flip-flop circuit) 514, an output circuit (e.g., D type flip-flop circuit) 519, logic circuitry 520 between input and output circuits 514 and 519, and a delay circuit 570 coupled between nodes A and C. Delay circuit 570 can include inverters 571, 572, and 573 coupled in series between node A and node C.

CDR system 515 can include components similar to those of CDR system 315 (FIG. 3) or CDR system 415 (FIG. 4) that are omitted from FIG. 5A for simplicity. For example, logic circuitry 520 can correspond to part of path 420 (e.g., proportional control path) of FIG. 4, input circuit 514 can correspond to sampler circuit 414D or 414E of FIG. 4, and output circuit 519 can correspond to output circuit 419 of FIG. 4.

As shown in FIG. 5A, CDR system 515 can include a path (e.g., logic path) 581 and a path (e.g., clock path) 582. Path 581 can include a circuit path from node A to node B. Path 582 can include a circuit path from node A to node C. Node A can be a clock input node of input circuit 514. Node B can be an input node (e.g., data input node) of output circuit 519. Node C can be a clock input node of output circuit 519.

Input circuit 514 can receive signal $V_{IN}$ based on timing of clock signal $CLK_Z$ and provide information (e.g., sampled information) at its output (which is coupled to logic circuitry 520). Logic circuitry 520 can process information from the output of input circuit 514 and provide the processed information (e.g., the result of the processing) at node B. Output circuit 519 can receive information from node B based on timing of clock signal $CLK_Z'$. Output circuit 519 can generate information UPDATE (e.g., output information) based on the information from node B. Information UPDATE can be used to generate part of proportional control information to control a DCO (not shown) of CDR system 515. For example, information UPDATE can correspond to information UPDATE_P of FIG. 3 and FIG. 4.

Delay circuit 570 of CDR system 315 can be configured, such that time delays (e.g., propagation delay and device variation) between paths 581 and 582 can be matched. FIG. 5A shows an example where delay circuit 570 includes inverters 571, 572, and 573 coupled in series between node A and node C. However, delay circuit 570 can have a different structure if delay circuit 570 can propagate (can drive) clock signal $CLK_Z$ from node A to node C within a selected (e.g., predetermined) time interval. The selected time interval can be based on (e.g., equal to) the processing time (e.g., a time interval) measured from a time logic circuitry 520 operating on an input information (e.g., a sample of signal $V_{IN}$) to a time logic circuitry 520 providing output information at node B. Logic circuitry 520 can include multiple layers (e.g., stages) of logic cells. The processing time of logic circuitry 520 can be within one period of clock signal $CLK_Z$. The frequency of clock signal $CLK_Z$ can be less than (e.g., 0.5 time) the frequency of a clock signal (not shown) generated by the output of the DCO of CDR system 515.

Matching the time delays of paths 581 and 582 as shown in FIG. 5A can improve (e.g., reduce) the latency of proportional control path (e.g., that can include logic circuitry 520) of CDR system 515 and improve the timing margin (e.g., setup and hold time margins) for the signal that represents the information at node B.

Figure 5B:
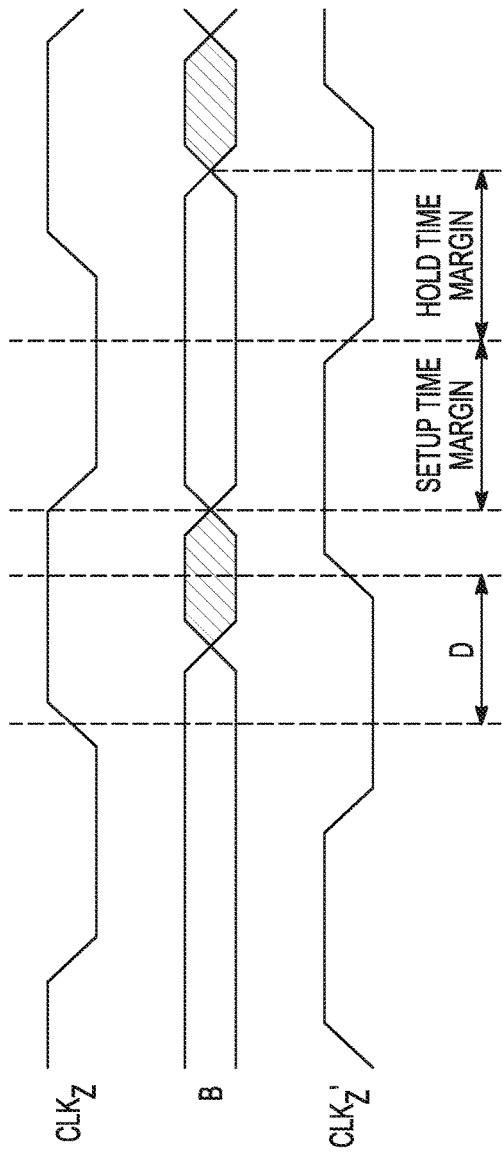
FIG. 5B shows a timing diagram for information and clock signals of the CDR system of FIG. 5A, according to some embodiments described herein.

FIG. 5B shows a timing diagram for clock signals $CLK_Z$ and $CLK_Z'$ and information at node B of FIG. 5A, according to some embodiments described herein. As shown in FIG. 5B, clock signal $CLK_Z'$ can be a delayed version of clock signal $CLK_Z$. The time delay between clock signals $CLK_Z$ and $CLK_Z'$ is shown as time delay D. The value of time delay D can be selected (e.g., adjusted) by structuring delay circuit 570 of FIG. 5A (e.g., by placing an appropriate number of inverters between node A and node C). In the example of FIG. 5A, the time delay of delay circuit 570 can be based on the number of series-connected inverters between nodes A and C. For example, fewer inverters may be placed between nodes A and C to decrease the time delay of delay circuit 570. In another example, more inverters may be placed between nodes A and C to increase the time delay of delay circuit 570. As shown in FIG. 5B, the signal at node B can have a setup time margin and a hold time margin. Delay circuit 570 can be structured to improve (e.g., increase) the setup and hold time margins of the signal at node B. This in turn can allow a proportional control path (which can include node B) of CDR system 515 to be implemented with fewer stages in order to reduce latency of the proportional control path.

Figure 6:
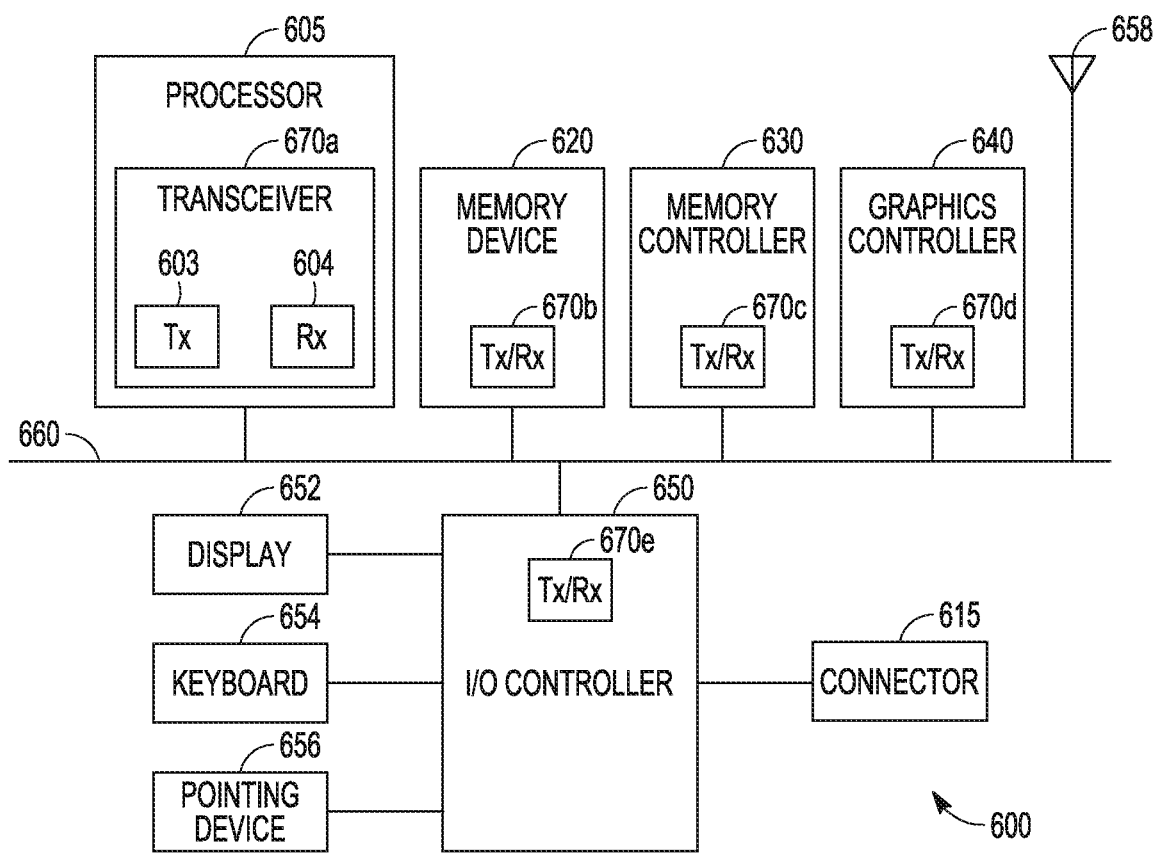
FIG. 6 shows an apparatus in the form of an electronic system, according to some embodiments described herein.

FIG. 6 shows an apparatus in the form of a system (e.g., electronic system) 600, according to some embodiments described herein. System 600 can include or be included in a computer, a tablet, or other electronic system. As shown in FIG. 6, system 600 can include components, such as a processor 605, a memory device 620, a memory controller 630, a graphics controller 640, an RF transceiver 645, an I/O controller 650, a display 652, a keyboard 654, a pointing device 656, at least one antenna 658, a connector 615, and a bus 660. Bus 660 can include conductive lines (e.g., metal-based traces on a circuit board where the components of system 600 are located).

In some arrangements, system 600 does not have to include a display. Thus, display 652 can be omitted from system 600. In some arrangements, system 600 does not have to include any antenna 658. Thus, antenna 658 can be omitted from system 600.

Processor 605 can include a general-purpose processor or an application-specific integrated circuit (ASIC). Processor 605 can include a CPU.

Memory device 620 can include a dynamic random access memory (DRAM) device, a static random access memory (SRAM) device, a flash memory device, phase change memory, a combination of these memory devices, or other types of memory. FIG. 6 shows an example where memory device 620 is a stand-alone memory: device separated from processor 605. In an alternative arrangement, memory device 620 and processor 605 can be located on the same die. In such an alternative arrangement, memory device 620 is an embedded memory in processor 605, such as embedded DRAM (eDRAM), embedded SRAM (eSRAM), embedded flash memory, or another type of embedded memory.

Display 652 can include a liquid crystal display (LCD), a touchscreen (e.g., capacitive or resistive touchscreen), or another type of display. Pointing device 656 can include a mouse, a stylus, or another type of pointing device.

I/O controller 650 can include a communication module for wired or wireless communication (e.g., communication through one or more antenna 658). Such wireless communication may include communication in accordance with WiFi communication technique, Long Term Evolution Advanced (LTE-A) communication technique, or other communication techniques.

I/O controller 650 can also include a module to allow system 600 to communicate with other devices or systems in accordance with one or more of the following standards or specifications (e.g., I/O standards or specifications): Universal Serial Bus (USB), DisplayPort (DP), High-Definition Multimedia Interface (HDMI), Thunderbolt, Peripheral Component Interconnect Express (PCIe), Ethernet, and other specifications.

Connector 615 can be arranged (e.g., can include terminals, such as pins) to allow system 600 to be coupled to an external device (or system). This may allow system 600 to communicate (e.g., exchange information) with such a device (or system) through connector 615.

Connector 615 and at least a portion of bus 660 can include conductive lines that conform with at least one of USB, DP, HDMI, Thunderbolt PCIe, Ethernet, and other specifications.

As shown in FIG. 6, processor 605 can include a transceiver (Tx/Rx) 670a having a transmitter (Tx) 603 and a receiver (Rx) 604. Transmitter 603 can operate to transmit information from processor 605 to another part of system 600 or to an external device (or system) coupled to connector 615. Receiver 604 of processor 605 can operate to receive information from another part of system 600 or from an external device (or system) coupled to connector 615. For example, receiver 604 can receive information (e.g., data signals) from one or more of memory device 620, memory controller 630, graphics controller 640, RF transceiver 645, and I/O controller 650. Receiver 604 can include components and operations of any of the receivers (including CDR systems) described above with reference to FIG. 1 through FIG. 5B.

As shown in FIG. 6, memory device 620, memory controller 630, graphics controller 640, RF transceiver 645, and I/O controller 650 can include transceivers 670b, 670c, 670d, 670e, and 670f, respectively, to allow each of these components to transmit and receive information through their respective transceiver. At least one of transceivers 670b, 670c, 670d, 670e, and 670f can be similar to or identical to transceiver 670a. Thus, at least one of transceivers 670b, 670c, 670d, 670e, and 670f can include a receiver similar to or identical to receiver 604. For example, at least one of transceivers 670b, 670c, 670d, 670e, and 670f can include a receiver that can be arranged to allow at least one of memory device 620, memory controller 630, graphics controller 640, RF transceiver 645, and I/O controller 650 to receive information (e.g., signals $V_{RX0}$ through $V_{RXi}$) from another part of system 600 or from an external device (or system) coupled to connector 615.

FIG. 6 shows the components of system 600 arranged separately from each other as an example. For example, each of processor 605, memory device 620, memory controller 630, graphics controller 640, RF transceiver 645, and I/O controller 650 can be located on a separate IC (e.g., semiconductor die or an IC chip). In some arrangements, two or more components (e.g., processor 605, memory device 620, graphics controller 640, RF transceiver 645, and I/O controller 650) of system 600 can be located on the same die (e.g., same IC chip) that forms a system-on-chip (SoC).

The illustrations of the apparatuses (e.g., apparatus 100 including receiver 104, receiver 204 CDR systems 315, 415, and 515, and system 700) and methods (e.g., operations of apparatus including receiver 104, and operations of receiver 204, CDR systems 315, 415, and 515, and system 700) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

Additional Notes and Examples

Example 1 includes subject matter (such as a device, an electronic apparatus (e.g., circuit, electronic system, or both), or a machine) including sampling circuitry to sample an input signal and provide data information and phase error information based on the input signal, a first circuit path to provide proportional control information based on the data information and phase error information, the second circuit path to operate at a first frequency, a second circuit path to provide integral control information based on the data information and phase error information, the second circuit path to operate at a second frequency, the first frequency being higher than the first frequency, a digitally controlled oscillator to generate a clock signal and control a timing of the clock signal based on the integral control information and the proportional control information.

In Example 2, the subject matter of Example 1 may optionally include, wherein the first circuit path includes a first phase detector to receive a first portion of the data information and a first portion of the phase error information and generate first information, a second phase detector to receive a second portion of the data information and a second portion of the phase error information and generate second information, and output circuit to generate the output information based on the first and second information, and the proportional control information having value based on the output information.

In Example 3, the subject matter of Example 1 or 2 may optionally include, wherein the first circuit path further includes a third phase detector to receive a third portion of the data information and a third portion of the phase error information and generate third information, and the output circuit to generate output information based on the first, second, third information.

In Example 4, the subject matter of Example 1 or 2 may optionally include, wherein further comprising a frequency divider to receive the clock signal from the digitally controlled oscillator and generate a first clock signal and a second clock signal having, the first clock signal having a frequency higher than the first clock signal, wherein the first circuit path is to operate using the first clock signal, and the second circuit path is to operate using the clock signal.

In Example 5, the subject matter of Example 1 may optionally include, wherein the sampling circuitry includes samplers, a first demultiplexer having an input coupled to the output of the samplers, and an output coupled to an input of the first circuit path to provide the data information and the phase error information to the first circuit path, and a second demultiplexer having an input coupled to the output of the first demultiplexer, and an output coupled to an input of the second circuit path to provide the data information and the phase error information to the second circuit path.

In Example 6, the subject matter of Example 1 optionally include, wherein the first circuit path includes an input circuit to receive the input signal using timing of a first clock signal, an output circuit to generate output information using timing of a second clock signal, the proportional control information having value based on the output information, logic circuitry coupled between the input and output circuits, and a circuit coupled to provide a time delay to the first clock signal to generate the second clock signal.

Example 7 includes subject matter (such as a device, an electronic apparatus (e.g., circuit, electronic system, or both), or a machine) including a digitally controlled oscillator to generate a clock signal having a timing based at least in part on capacitances of first capacitor circuit, and a second capacitor circuit, a first circuit path to provide proportional control information based on data information and phase error information generated from an input signal to control the first capacitor circuit, the first circuit path to operate at a first frequency, and a second circuit path to provide integral control information based on the data information and the phase error information generated from the input signal to control the second capacitor circuit, the first circuit path to operate at a second frequency, the first frequency being higher than the first frequency.

In Example 8, the subject matter of Example 7 may optionally include, wherein digitally controlled oscillator further includes a third capacitor circuit, and the second circuit path is to provide an additional control information based on the data information and the phase error information signal to control the third capacitor circuit.

In Example 9, the subject matter of Example 7 or 8 may optionally include, wherein the first circuit path includes a first programmable phase detector and a proportional control logic coupled to the first programmable phase detector to provide the proportional control information to the digitally controlled oscillator, and the second circuit path includes a second programmable phase detector and an integral control logic coupled to the second programmable phase detector to provide the integral control information to the digitally controlled oscillator.

In Example 10, the subject matter of Example 7 may optionally include, wherein the first circuit path includes a selector having a first input coupled to the first programmable phase detector, a second input coupled to the second programmable phase detector, and an output coupled to the proportional control logic.

In Example 11, the subject matter of Example 7 or 8 may optionally include, wherein the first circuit path includes a first demultiplexer, a second demultiplexer, phase detectors coupled to the first and second demultiplexers, logic circuitries, each of the logic circuitries coupled to a respective phase detector among the phase detectors, and a multiplexer coupled to the logic circuitries, In Example 12, the subject matter of Example 7 may optionally include, wherein the sampling circuitry includes samplers, a first demultiplexer coupled between the samplers and the first circuit path, and a second demultiplexer coupled between the first demultiplexer and the second circuit path.

In Example 13, the subject matter of Example 12 may optionally include, wherein the first demultiplexer is a 1:X demultiplexer, and the second demultiplexer is a 1:Y demultiplexer, X and Y are integers, and X and Y have different values.

In Example 14, the subject matter of Example 7 may optionally include, wherein the first circuit path includes an input circuit to receive the input signal, the input circuit to receive a first clock signal at a first node, an output circuit to generate output information based on the data information and the phase error information, the output circuit to receive a second clock signal at a second node, logic circuitry coupled between the input and output circuits to generate the data information and phase error information, and a delay circuit coupled between the first and second nodes.

In Example 15, the subject matter of Example 7 may optionally include, wherein the delay circuit includes inverters coupled in series between the first and second nodes.

Example 16 includes subject matter (such as a device, an electronic apparatus (e.g., circuit, electronic system, or both), or a machine) including conductive lines on a circuit board, a first device including a transmitter coupled to the conductive lines, and a second device including a receiver coupled to the conductive lines to receive an input signal from the conductive lines, the receiver including sampling circuitry to sample the input signal and provide data information and phase error information based on the input signal, a first circuit path to provide proportional control information based on the data information and phase error information, the second circuit path to operate at a first frequency, a second circuit path to provide integral control information based on the data information and phase error information, the second circuit path to operate at a second frequency, the first frequency being higher than the first frequency, and a digitally controlled oscillator to generate a clock signal and control a timing of the clock signal based on the integral control information and the proportional control information.

In Example 17, the subject matter of Example 16 may optionally include, wherein the receiver includes a clock and data recovery system, and the sampling circuitry, first circuit path, and digitally controlled oscillator are parts of the clock and data recovery system.

In Example 18, the subject matter of Example 16 may optionally include, wherein the second device includes a processor, In Example 19, the subject matter of Example 16 may optionally include, further comprising an antenna coupled to the second device.

In Example 20, the subject matter of any of Examples 16-19 may optionally include, further comprising a connector coupled to the second device, the connector conforming with one of Universal Serial Bus (USB), High-Definition Multimedia Interface (HDMI), Thunderbolt, Peripheral Component interconnect Express (PCIe), and Ethernet specifications.

In the detailed description and the claims, a list of items joined by the term "one of" can mean only one of the listed items. For example, if items A and B are listed, then the phrase "one of A and B" means A only (excluding B), or B only (excluding A). In another example, if items A, B, and C are listed, then the phrase "one of A, B, and C" means A only, B only, or C only. Item A can include a single element or multiple elements. Item B can include a single element or multiple elements. Item C can include a single element or multiple elements.

In the detailed description and the claims, a list of items joined by the term "at least one of" can mean any combination of the listed items. For example, if items A and B are listed, then the phrase "at least one of A and B" means A only, B only, or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
    sampling circuitry to sample an input signal and provide data information and phase error information based on the input signal;
    a first circuit path to provide proportional control information based on the data information and phase error information, the first circuit path to operate at a first frequency;
    a second circuit path to provide integral control information based on the data information and phase error information, the second circuit path to operate at a second frequency, the first frequency being higher than the second frequency; and
    a digitally controlled oscillator to generate a clock signal and control a timing of the clock signal based on the integral control information and the proportional control information.

2. The apparatus of claim 1, wherein the first circuit path includes:
    a first phase detector to receive a first portion of the data information and a first portion of the phase error information and generate first information;
    a second phase detector to receive a second portion of the data information and a second portion of the phase error information and generate second information; and
    an output circuit to generate output information based on the first and second information, and the proportional control information having value based on the output information.

3. The apparatus of claim 2, wherein the first circuit path further includes:
    a third phase detector to receive a third portion of the data information and a third portion of the phase error information and generate third information, and
    the output circuit to generate the output information based on the first, second, and third information.

4. The apparatus of claim 1, further comprising a frequency divider to receive the clock signal from the digitally controlled oscillator and generate a first clock signal and a second clock signal, the first clock signal having a frequency higher than the second clock signal, wherein the first circuit path is to operate using the first clock signal, and the second circuit path is to operate using the second clock signal.

5. The apparatus of claim 1, wherein the sampling circuitry includes:
    samplers;
    a first demultiplexer having an input coupled to the output of the samplers, and an output coupled to an input of the first circuit path to provide the data information and the phase error information to the first circuit path; and
    a second demultiplexer having an input coupled to the output of the first demultiplexer, and an output coupled to an input of the second circuit path to provide the data informnation and the phase error information to the second circuit path.

6. The apparatus of claim 1, further comprising a circuit, wherein:
    the sampling circuitry includes an input circuit to receive the input signal using timing of a first clock signal;
    the first circuit path includes an output circuit to generate output information using timing of a second clock signal, the proportional control information having value based on the output information, and logic circuitry coupled between the input and output circuits; and
    the circuit is coupled to provide a time delay to the first clock signal to generate the second clock signal.

7. An apparatus comprising:
    a digitally controlled oscillator to generate a clock signal having a timing based at least in part on capacitances of a first capacitor circuit, and a second capacitor circuit;
    a first circuit path to provide proportional control information based on data information and phase error information generated from an input signal to control the first capacitor circuit, the first circuit path to operate at a first frequency; and a second circuit path to provide integral control information based on the data information and the phase error information generated from the input signal to control the second capacitor circuit, the second circuit path to operate at a second frequency, the first frequency being higher than the second frequency.

8. The apparatus of claim 7, wherein digitally controlled oscillator further includes a third capacitor circuit, and the second circuit path is to provide an additional control information based on the data information and the phase error information signal to control the third capacitor circuit.

9. The apparatus of claim 7, wherein:
the first circuit path includes a first programmable phase detector and a proportional control logic coupled to the first programmable phase detector to provide the proportional control information to the digitally controlled oscillator; and
the second circuit path includes a second programmable phase detector and an integral control logic coupled to the second programmable phase detector to provide the integral control information to the digitally controlled oscillator.

10. The apparatus of claim 9, wherein the first circuit path includes a selector having a first input coupled to the first programmable phase detector, a second input coupled to the second programmable phase detector, and an output coupled to the proportional control logic.

11. The apparatus of claim 7, wherein the first circuit path includes:
a first demultiplexer;
a second demultiplexer;
phase detectors coupled to the first and second demultiplexers;
logic circuitries, each of the logic circuitries coupled to a respective phase detector among the phase detectors; and
a multiplexer coupled to the logic circuitries.

12. The apparatus of claim 7, further comprising:
samplers;
a first demultiplexer coupled between the samplers and the first circuit path; and
a second demultiplexer coupled between the first demultiplexer and the second circuit path.

13. The apparatus of claim 12, wherein the first demultiplexer is a 1:X demultiplexer, and the second demultiplexer is a 1:Y demultiplexer, X and Y are integers greater than one, and X and Y have different values.

14. The apparatus of claim 7, further comprising a delay circuit, and an input circuit to receive the input signal, the input circuit to receive a first clock signal at a first node, wherein the first circuit path includes an output circuit to generate output information based on the data information and the phase error information, the output circuit to receive a second clock signal at a second node and logic circuitry coupled between the input and output circuits to generate the data information and phase error information, and wherein the delay circuit is coupled between the first and second nodes.

15. The apparatus of claim 14, wherein the delay circuit includes inverters coupled in series between the first and second nodes.

16. An apparatus comprising:
conductive lines on a circuit board;
a first device including a transmitter coupled to the conductive lines; and
a second device including a receiver coupled to the conductive lines to receive an input signal from the conductive lines, the receiver including:
sampling circuitry to sample the input signal and provide data information and phase error information based on the input signal;
a first circuit path to provide proportional control information based on the data information and phase error information, the first circuit path to operate at a first frequency;
a second circuit path to provide integral control information based on the data information and phase error information, the second circuit path to operate at a second frequency, the first frequency being higher than the second frequency; and
a digitally controlled oscillator to generate a clock signal and control a timing of the clock signal based on the integral control information and the proportional control information.

17. The apparatus of claim 16, wherein the receiver includes a clock and data recovery system, and the sampling circuitry, first circuit path, and digitally controlled oscillator are parts of the clock and data recovery system.

18. The apparatus of claim 16, wherein the second device includes a processor.

19. The apparatus of claim 6, further comprising an antenna coupled to the second device.

20. The apparatus of claim 16, further comprising a connector coupled to the second device, the connector conforming with one of Universal Serial Bus (USB), High-Definition Multimedia Interface (HDMI), Thunderbolt, Peripheral Component Interconnect Express (PCIe), and Ethernet specifications.

* * * * *